United States Patent
Wakana et al.

(10) Patent No.: US 10,238,012 B2
(45) Date of Patent: Mar. 19, 2019

(54) WATERPROOF COMPONENT-SUPPRESSING ELECTRONIC CONTROL DEVICE

(71) Applicant: Hitachi Automotive Systems, Ltd., Hitachinaka-shi, Ibaraki (JP)

(72) Inventors: Yoshinori Wakana; Masaru Kamoshida, Hitachinaka (JP); Takeshi Igarashi, Hitachinaka (JP); Kiyotaka Kanno, Hitachinaka (JP)

(73) Assignee: HITACHI AUTOMOTIVE SYSTEMS, LTD, Hitachinaka-Shi (JP)

( * ) Notice: Subject to any disclaimer, the term of this patent is extended or adjusted under 35 U.S.C. 154(b) by 0 days.

(21) Appl. No.: 15/026,108

(22) PCT Filed: Oct. 1, 2014

(86) PCT No.: PCT/JP2014/076240
§ 371 (c)(1),
(2) Date: Mar. 30, 2016

(87) PCT Pub. No.: WO2015/050145
PCT Pub. Date: Apr. 9, 2015

(65) Prior Publication Data
US 2016/0249489 A1    Aug. 25, 2016

(30) Foreign Application Priority Data
Oct. 2, 2013 (JP) ................. 2013-207431

(51) Int. Cl.
*H05K 7/20* (2006.01)
*H05K 1/02* (2006.01)
(Continued)

(52) U.S. Cl.
CPC ....... *H05K 7/20854* (2013.01); *H01R 12/721* (2013.01); *H05K 1/0203* (2013.01); *H05K 5/0039* (2013.01); *H01R 13/5219* (2013.01)

(58) Field of Classification Search
USPC .................... 174/548; 361/728-837
See application file for complete search history.

(56) References Cited

U.S. PATENT DOCUMENTS 3,745,515 A * 7/1973 Michaels ............ H01R 27/02
439/651
4,149,027 A * 4/1979 Asher .................. G06F 1/183
174/359
(Continued)

FOREIGN PATENT DOCUMENTS

DE    7039361 U    2/1971
EP    2071911 A2    6/2009
(Continued)

OTHER PUBLICATIONS

PCT International Search Report issued in application PCT/JP2014/076240 dated Dec. 2, 2014; 2 pages.
(Continued)

*Primary Examiner* — Dimary S Lopez Cruz
*Assistant Examiner* — Muhammed Azam
(74) *Attorney, Agent, or Firm* — Foley & Lardner LLP

(57) ABSTRACT

An electronic control device is provided with a resin base, a substrate, and a resin cover. The resin base has at least one opening part. The resin cover formed in a cylindrical shape with a bottom is fixed on an inner surface of the resin base forming the opening part. The resin cover has a slit. The substrate has a card edge connector to be inserted into the slit. An electronic component is mounted on the substrate.

19 Claims, 10 Drawing Sheets

(51) Int. Cl.
  *H05K 5/00* (2006.01)
  *H01R 12/72* (2011.01)
  *H01R 13/52* (2006.01)

(56) References Cited

U.S. PATENT DOCUMENTS

| | | | | |
|---|---|---|---|---|
| 4,167,647 A * | 9/1979 | Salera | ............ | H01L 23/057 174/527 |
| 4,607,276 A * | 8/1986 | Butt | ............ | H01L 23/49568 257/668 |
| 4,806,123 A * | 2/1989 | Konishi | ............ | H01R 13/4364 439/595 |
| 4,934,959 A * | 6/1990 | Zielinski | ............ | H01R 13/4364 439/595 |
| 5,243,131 A * | 9/1993 | Jakob | ............ | H05K 7/20854 174/536 |
| 5,280,410 A * | 1/1994 | Klinger | ............ | H05K 7/20854 257/719 |
| 5,305,179 A * | 4/1994 | Sono | ............ | H01L 23/49555 174/16.3 |
| 5,323,298 A * | 6/1994 | Shatas | ............ | H05K 9/0062 174/385 |
| 5,398,166 A * | 3/1995 | Yonezawa | ............ | H05K 3/306 174/260 |
| 5,435,738 A * | 7/1995 | Isohata | ............ | H01R 13/62933 439/157 |
| 5,470,246 A * | 11/1995 | Mosquera | ............ | H01R 12/79 439/260 |
| 5,507,668 A | 4/1996 | Lambrinos et al. | | |
| 5,589,129 A * | 12/1996 | Kato | ............ | B29C 70/62 264/108 |
| 5,597,326 A * | 1/1997 | DeLessert | ............ | H01R 12/79 439/607.08 |
| 5,635,754 A * | 6/1997 | Strobel | ............ | H01L 23/055 257/659 |
| 5,644,839 A * | 7/1997 | Stone | ............ | H01R 12/57 29/842 |
| 5,653,638 A * | 8/1997 | Nagata | ............ | H01R 12/721 463/44 |
| 5,686,714 A * | 11/1997 | Abe | ............ | G06K 7/0021 235/435 |
| 5,820,236 A * | 10/1998 | Aoki | ............ | G06F 1/181 312/223.2 |
| 5,880,403 A * | 3/1999 | Czajkowski | ............ | H01L 23/055 174/387 |
| 5,998,867 A * | 12/1999 | Jensen | ............ | H01L 23/3135 174/104 |
| 6,093,061 A * | 7/2000 | Varsik | ............ | H01R 13/506 439/632 |
| 6,163,079 A * | 12/2000 | Miyazaki | ............ | B60R 11/02 307/10.1 |
| 6,300,673 B1 * | 10/2001 | Hoffman | ............ | H01L 23/057 257/666 |
| 6,344,975 B1 * | 2/2002 | Gayle | ............ | H01R 4/14 361/785 |
| 6,358,078 B1 * | 3/2002 | Crippa | ............ | H01R 13/622 439/283 |
| 6,362,914 B2 * | 3/2002 | Baumann | ............ | C09K 9/02 252/583 |
| 6,426,877 B1 * | 7/2002 | Baba | ............ | H01L 23/3675 174/138 G |
| 6,498,731 B1 * | 12/2002 | Roscoe | ............ | H05K 7/1408 361/741 |
| 6,613,978 B2 * | 9/2003 | Czjakowski | ............ | G21F 1/08 174/388 |
| 6,666,695 B1 * | 12/2003 | Yeh | ............ | H01R 12/721 439/541.5 |
| 6,749,465 B1 * | 6/2004 | Huang | ............ | H01R 12/721 439/630 |
| 6,973,177 B2 * | 12/2005 | Mori | ............ | H04Q 1/10 361/600 |
| 7,054,164 B2 * | 5/2006 | Shih-Tsung | ............ | H05K 7/1429 361/752 |
| 7,165,991 B2 * | 1/2007 | Sato | ............ | H01R 12/592 439/329 |
| 7,309,247 B1 * | 12/2007 | Keating | ............ | H01R 13/5219 439/271 |
| 7,435,132 B1 * | 10/2008 | Fong | ............ | H01R 9/038 439/497 |
| 7,438,578 B1 * | 10/2008 | Nin | ............ | H01R 12/89 439/260 |
| 7,440,293 B2 * | 10/2008 | Hood, III | ............ | G06F 1/184 361/807 |
| 7,507,116 B2 * | 3/2009 | Laerke | ............ | H01R 9/0521 439/578 |
| 7,920,388 B2 * | 4/2011 | Huang | ............ | G06F 1/185 361/756 |
| 7,997,917 B1 * | 8/2011 | O'Neill | ............ | H01R 13/5208 439/275 |
| 8,235,295 B2 * | 8/2012 | Trampert | ............ | G06K 13/08 235/486 |
| 8,337,248 B1 * | 12/2012 | Lan | ............ | H01R 12/57 439/607.35 |
| 8,356,762 B2 * | 1/2013 | Tomikawa | ............ | B60R 16/0239 165/185 |
| 2001/0019904 A1 * | 9/2001 | Watanabe | ............ | H05K 7/1439 439/65 |
| 2001/0044230 A1 * | 11/2001 | Suzuki | ............ | H01R 13/5219 439/186 |
| 2002/0079653 A1 * | 6/2002 | Noguchi | ............ | H05K 5/061 277/628 |
| 2004/0189926 A1 * | 9/2004 | Yamaji | ............ | G02F 1/13452 349/149 |
| 2005/0018410 A1 * | 1/2005 | Brandenburg | ............ | H01R 13/6658 361/782 |
| 2005/0200045 A1 * | 9/2005 | Hunkeler | ............ | B60R 16/0239 264/272.11 |
| 2005/0233618 A1 * | 10/2005 | Yamashita | ............ | H05K 7/026 439/76.2 |
| 2005/0241848 A1 * | 11/2005 | Michaud | ............ | H05K 3/242 174/250 |
| 2006/0043895 A1 * | 3/2006 | Choi | ............ | H01J 11/10 313/587 |
| 2006/0234523 A1 * | 10/2006 | Baranski | ............ | H01Q 1/1271 439/67 |
| 2007/0020981 A1 | 1/2007 | Matsuo | | |
| 2008/0291602 A1 * | 11/2008 | Devoe | ............ | H01G 4/232 361/306.3 |
| 2009/0147482 A1 * | 6/2009 | Katsuro | ............ | H05K 7/20454 361/721 |
| 2009/0286418 A1 * | 11/2009 | Takehara | ............ | H01R 13/62955 439/352 |
| 2009/0305548 A1 * | 12/2009 | Takehara | ............ | H01R 13/641 439/354 |
| 2009/0324171 A1 * | 12/2009 | Yasuda | ............ | G02B 6/4201 385/40 |
| 2010/0091469 A1 * | 4/2010 | Lin | ............ | H01R 12/721 361/752 |
| 2010/0200290 A1 * | 8/2010 | Tokunaga | ............ | H05K 7/142 174/548 |
| 2010/0248540 A1 * | 9/2010 | Eshima | ............ | H01R 4/185 439/607.01 |
| 2011/0000699 A1 * | 1/2011 | Bealka | ............ | H01G 4/35 174/151 |
| 2011/0070761 A1 * | 3/2011 | Takehara | ............ | H01R 4/305 439/271 |
| 2011/0165783 A1 * | 7/2011 | Tracy | ............ | H01R 12/721 439/61 |
| 2011/0256777 A1 * | 10/2011 | Schober | ............ | H05K 5/0039 439/660 |
| 2012/0034815 A1 * | 2/2012 | Nomura | ............ | H01R 9/03 439/492 |
| 2012/0127672 A1 * | 5/2012 | Osen | ............ | G06F 1/182 361/728 |
| 2012/0156916 A1 * | 6/2012 | Suzuki | ............ | B60L 11/1803 439/345 |
| 2012/0276759 A1 | 11/2012 | Tanaka et al. | | |
| 2013/0058044 A1 * | 3/2013 | Watanabe | ............ | H05K 5/006 361/714 |

(56) References Cited

U.S. PATENT DOCUMENTS

| | | | | |
|---|---|---|---|---|
| 2013/0141831 A1* | 6/2013 | Lee | H05K 5/0039 | 361/206 |
| 2013/0147267 A1* | 6/2013 | Wetzel | H01L 25/16 | 307/10.1 |
| 2013/0148317 A1* | 6/2013 | Sano | H05K 5/0004 | 361/752 |
| 2013/0292383 A1* | 11/2013 | Mullaney | B65D 53/06 | 220/378 |
| 2013/0316586 A1* | 11/2013 | Nagamine | H01R 12/721 | 439/630 |
| 2013/0319716 A1* | 12/2013 | Rost | H05K 5/061 | 174/50.5 |
| 2014/0113497 A1* | 4/2014 | Wang | H01R 13/52 | 439/660 |
| 2014/0213119 A1* | 7/2014 | Thackston | H01R 13/5227 | 439/676 |
| 2014/0322965 A1* | 10/2014 | Kuji | H01R 13/639 | 439/527 |
| 2014/0329405 A1* | 11/2014 | Hsieh | H05K 1/0209 | 439/485 |
| 2015/0031248 A1* | 1/2015 | Nishio | H01R 13/533 | 439/691 |
| 2016/0295721 A1* | 10/2016 | Furudate | B60R 16/02 | |

FOREIGN PATENT DOCUMENTS

| | | |
|---|---|---|
| JP | 56-96583 U | 7/1981 |
| JP | 10-092528 A | 4/1998 |
| JP | 3006398 B2 | 2/2000 |
| JP | 2007-335254 A | 12/2007 |
| JP | 2011-014390 A | 1/2011 |
| WO | WO-2013/050289 A1 | 4/2013 |
| WO | WO2013050289 * | 4/2013 |

OTHER PUBLICATIONS

Extended European Search Report dated May 18, 2017 issued in corresponding European application No. 14851353.4.

* cited by examiner

WATERPROOF COMPONENT-SUPPRESSING ELECTRONIC CONTROL DEVICE

TECHNICAL FIELD

The present invention relates to a control device on which an electronic component is mounted, in particular, to an electronic control device having a circuit substrate on which an electronic component is mounted.

BACKGROUND ART

An electronic control device which can improve reliability of connection between a connector terminal and a land corresponding to the connector terminal and reduce a manufacturing cost thereof is known (for example, see PTL 1).

In PTL 1, it is described that the electronic control device is provided with a substrate on which an electronic component is mounted, the substrate having a land on the surface, a surface mounting-type connector which has a plurality of terminals, each of which electrically connects an external connector and the substrate, disposed in a housing and electrically connected to corresponding lands, and a casing having a connector opening part to connect the connector and the external connector and storing the substrate and the connector. The housing is provided with a holding part for holding the plurality of terminals, and a protection part having a fixation portion for fixing the holding part, the protection part protecting a portion of the terminal exposed from the holding part and connected to the external connector. And the casing has a fitting part, which is fitted to a housing of the external connector, for electrically connecting the connector and the external connector.

CITATION LIST

Patent Literature

PTL 1: JP 2007-335254 A

SUMMARY OF INVENTION

Technical Problem

In the electronic control device disclosed in PTL 1, in order to reduce stress in fitting the connector, it is necessary to fix the housing, which fixes the connector terminal, and the external connector by using a sealing material. Further, the casing is formed to interpose the substrate in a vertical direction, and therefore sealing an upper and a lower casings by the sealing material is necessary. Further, since it is impossible to fix the housing, which includes the terminal electrically connecting the external connector and the substrate, with respect to a planar direction of the substrate, fixing the housing by another component or the sealing material is necessary.

In this way, the conventional electronic control device leads to an increase in a number of components for ensuring a waterproof property.

An object of the present invention is to provide an electronic control device capable of ensuring a waterproof property while suppressing a number of components.

Solution to Problem

In order to achieve the object, the present invention is an electronic control device including: a resin base having at least one opening part; a first resin cover fixed on an inner surface of the resin base forming a first opening part and formed in a cylindrical shape having a bottom and a first slit; a substrate having a first connector inserted into the first slit; and an electronic component mounted on the substrate.

Advantageous Effects of Invention

According to the present invention, ensuring the waterproof property while suppressing the number of components can be achieved. Other objects, features, and advantages of the present invention will become apparent from the following description of embodiments.

DESCRIPTION OF EMBODIMENTS

Figure 1A:
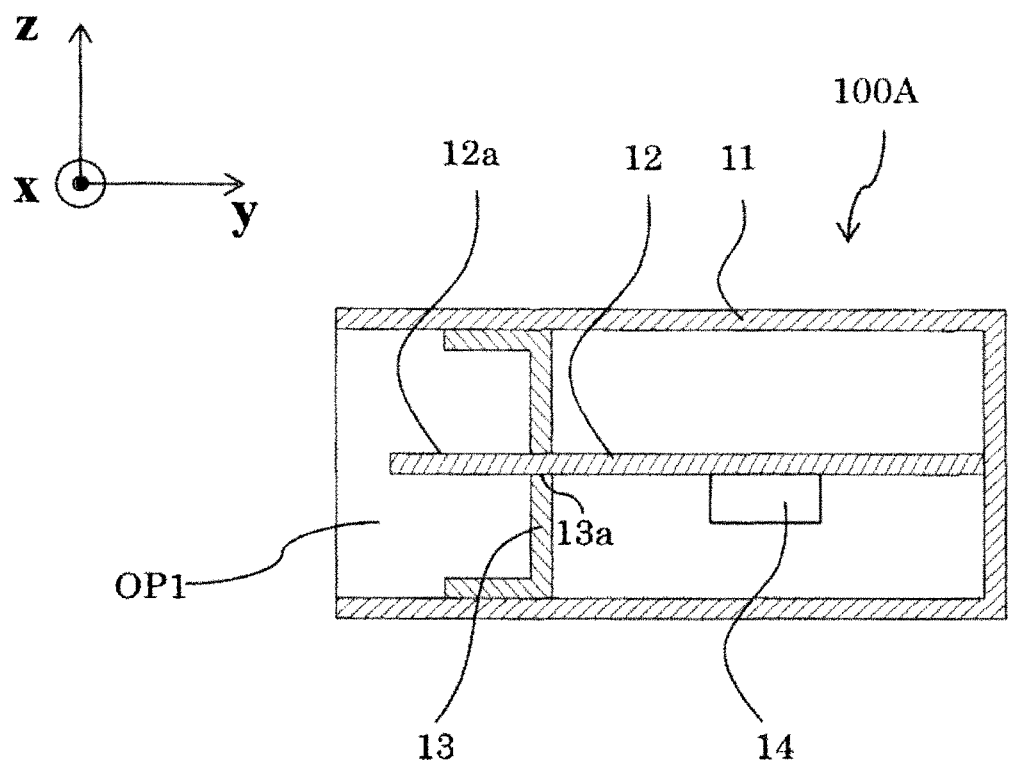
FIG. 1A is a cross-sectional view of an electronic control device according to a first embodiment of the present invention.

Hereinafter, an electronic control device according to first through seventh embodiments of the present invention is described with reference to drawings. The electronic control device is, for example, formed to control a device (fuel injection device, automatic transmission mechanism, or the like) mounted on a vehicle. Here, in each figure, the same reference numerals are assigned to the same parts.

First Embodiment

First, a configuration of an electronic control device 100A is described with reference to FIG. 1A. FIG. 1A is a cross-sectional view of the electronic control device 100A according to a first embodiment of the present invention.

The electronic control device 100A is provided with a resin base 11 (housing), a substrate 12, and a resin cover 13.

The resin base 11 formed in a cylindrical shape with a bottom has an opening part OP1. An electronic component 14 is mounted on the substrate 12. The substrate 12 has a card edge connector 12a electrically connected to an external female connector. The card edge connector 12a is inserted into a slit 13a formed on the resin cover 13. The resin cover 13 is fixed on an inner surface of the resin base 11 forming the opening part OP1.

Figure 1B:
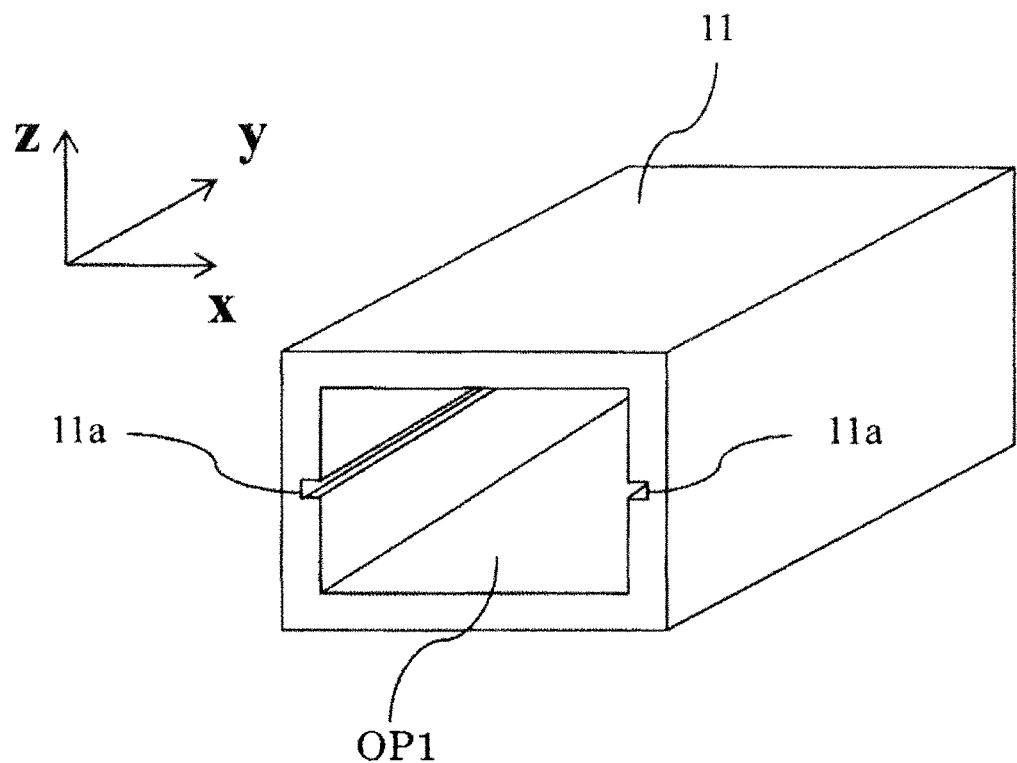
FIG. 1B is a perspective view of a resin base used in the electronic control device according to the first embodiment of the present invention.

Next, a configuration of the resin base 11 is described with reference to FIG. 1B. FIG. 1B is a perspective view of the resin base 11 used in the electronic control device 100A according to the first embodiment of the present invention.

The resin base 11 is provided with a guide 11a (groove) on the inner surface forming the opening part OP1. The substrate 12 is slid along the guide 11a and inserted.

Figure 1C:
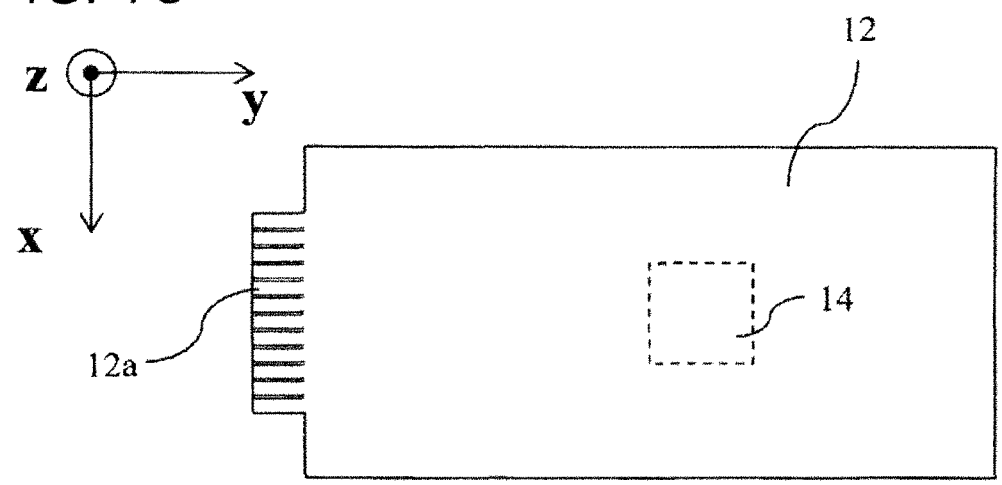
FIG. 1C is a top view of a substrate used in the electronic control device according to the first embodiment of the present invention.

Next, a configuration of the substrate 12 is described with reference to FIG. 1C. FIG. 1C is a top view of the substrate 12 used in the electronic control device 100A according to the first embodiment of the present invention.

The substrate 12 has the card edge connector 12a protruding in a longitudinal direction (y-axis (−)) of the substrate 12. The card edge connector 12a is electrically connected to the electronic component 14 via wiring mounted on the substrate 12.

Figure 1D:
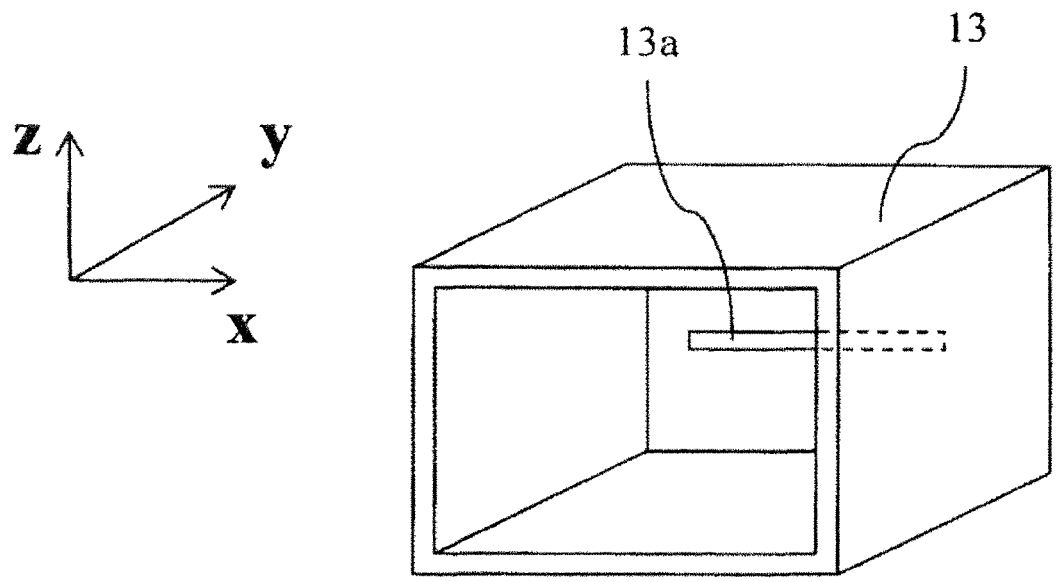
FIG. 1D is a perspective view of a resin cover used in the electronic control device according to the first embodiment of the present invention.

Next, a configuration of the resin cover 13 is described with reference to FIG. 1D. FIG. 1D is a perspective view of the resin cover 13 used in the electronic control device 100A according to the first embodiment of the present invention.

The resin cover 13 formed in a cylindrical shape with a bottom has the slit 13a at a bottom part thereof. The card edge connector 12a shown in FIG. 1C is inserted into the slit 13.

Figure 1E:
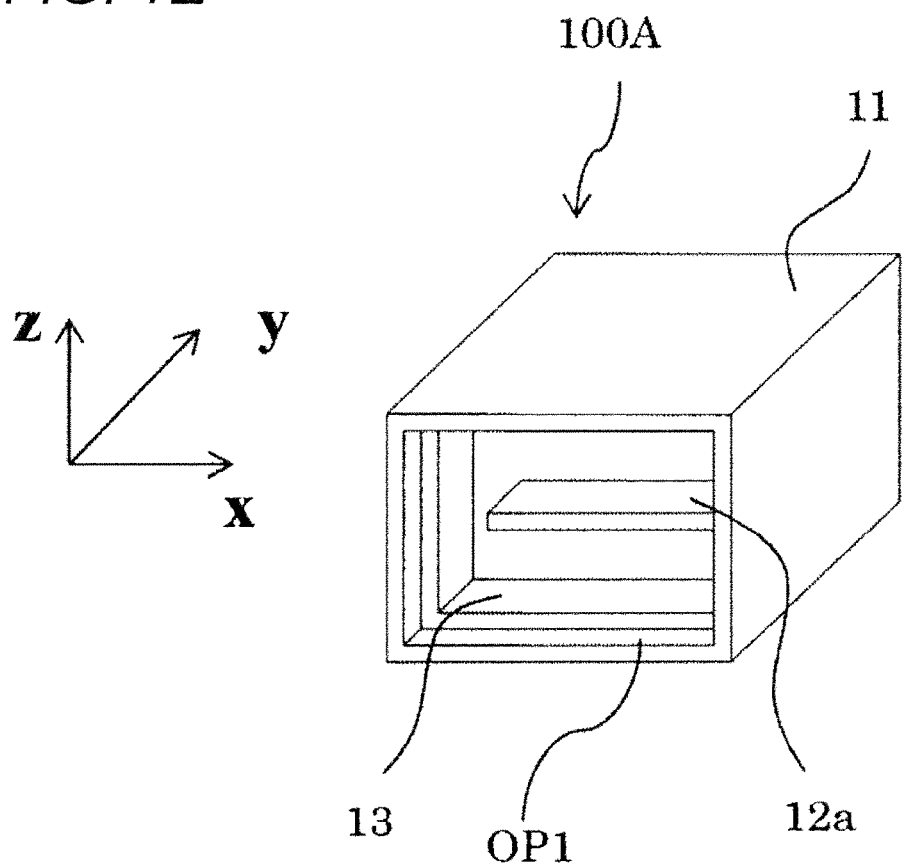
FIG. 1E is a perspective view of the electronic control device according to the first embodiment of the present invention.

Next, the configuration of the electronic control device 100A is described with reference to FIG. 1E. FIG. 1E is a perspective view of the electronic control device 100A according to the first embodiment of the present invention.

After the substrate 12 is slid and inserted into the resin base 11, the resin cover 13 is disposed to cover the opening part OP of the resin base 11 and fixed by an adhesive or the like. At this time, the card edge connector 12a mounted on the substrate 12 is inserted into the slit 13a formed on the resin cover 13. Thus, the card edge connector 12a is protruded from the slit 13a.

In this way, the resin base 11 forming the opening part OP1, the resin cover 13 and the card edge connector 12a are served as a male connector. That is, the opening part OP1 is served as a connector frontage.

Figure 1F:
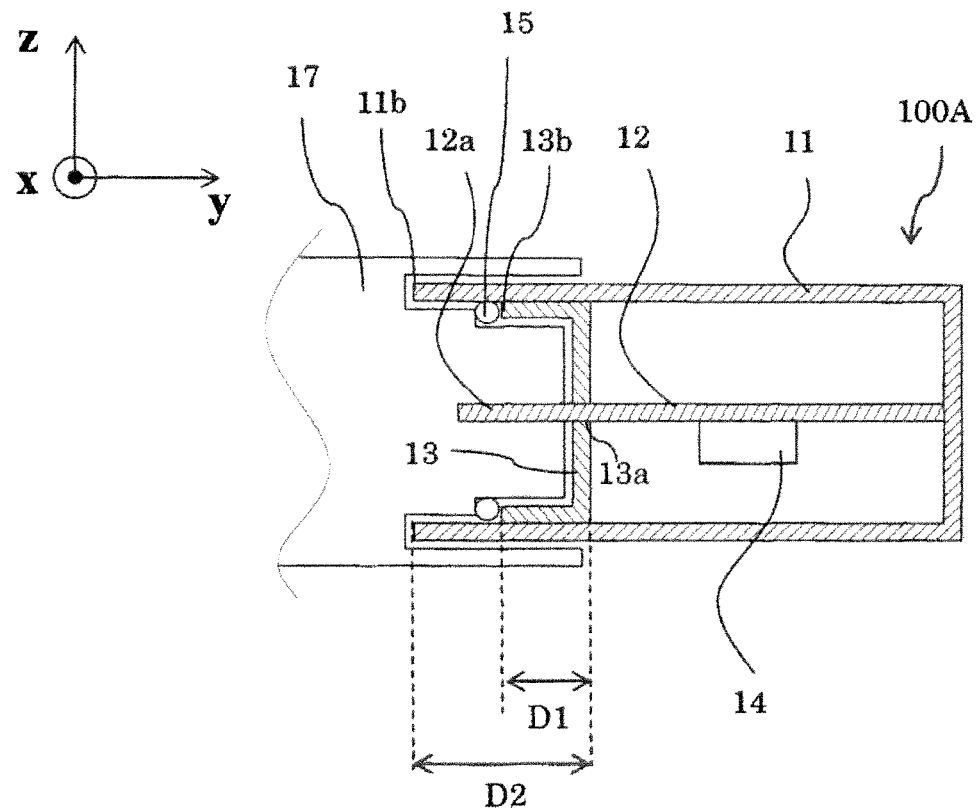
FIG. 1F illustrates a connection of the electronic control device and an external female connector according to the first embodiment of the present invention.

Next, a function of the electronic control device 100A is described with reference to FIG. 1F. FIG. 1F illustrates a connection of the electronic control device 100A and an external female connector 17 according to the first embodiment of the present invention.

As shown in FIG. 1F, an edge part of the electronic control device 100A at a side in which the card edge connector 12a is protruded is fitted with the external female connector 17.

A stepped part is formed by an edge 13b of the resin cover 13 and the inner surface of the resin base 11 forming the opening part. A sealing member 15 (for example, an elastic member such as a rubber seal) provided on the external female connector 17 is contacted with the stepped part. A distance D1 between the bottom part of the resin cover 13 and the edge 13b of the resin cover 13 is shorter than a distance D2 between the bottom part of the resin cover 13 and an edge 11b of the resin base 11.

The sealing member 15 waterproofs the card edge connector 12a. Further, the sealing member 15 prevents liquid such as water from entering the electronic control device 100A through a region where the slit 13a formed on the resin cover 13 and the substrate 12 are contacted with each other. Further, the sealing member 15 prevents water from entering the electronic control device 100A through a region where the resin cover 13 and the resin base 11 are contacted with each other.

Further, covering the opening part OP1 by the resin cover 13 before the external female connector 17 is fitted makes it possible to prevent dust from entering from the outside.

As described above, according to the present embodiment, it makes possible to ensure a waterproof property while suppressing a number of components. Further, less number of the components facilitates its assembling. Accordingly, the manufacturing cost can be reduced.

Second Embodiment

Figure 2A:
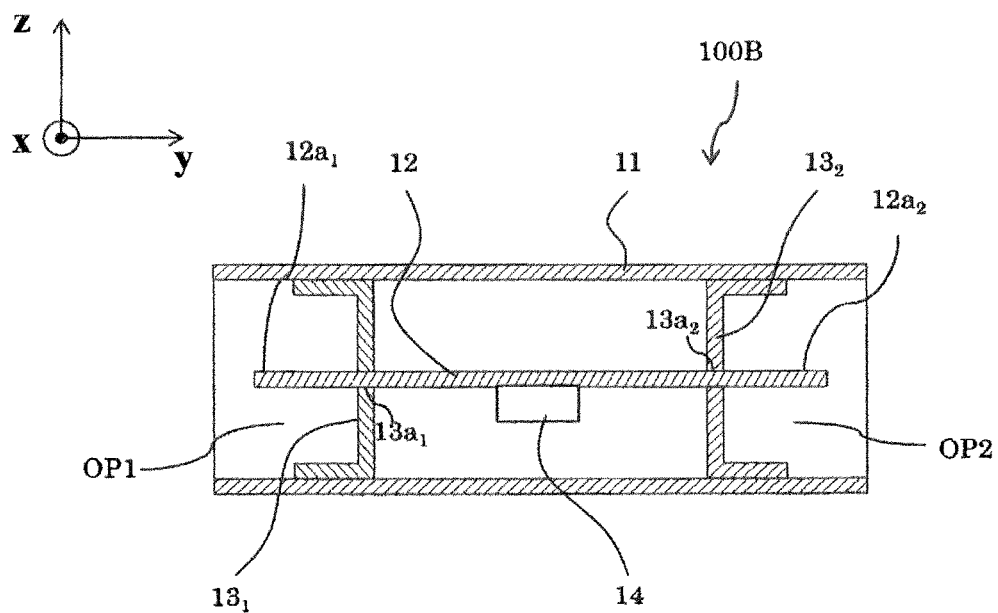
FIG. 2A is a cross-sectional view of an electronic control device according to a second embodiment of the present invention.

Next, a configuration of an electronic control device 100B is described with reference to FIG. 2A. FIG. 2A is a cross-sectional view of the electronic control device 100B according to a second embodiment of the present invention.

The electronic control device 100A is provided with a resin base 11, a substrate 12, and resin covers 13 ($13_1$ and $13_2$).

The resin base 11 has opening parts OP1 and OP2. In FIG. 2A, the opening part OP1 and the opening part OP2 are communicated with each other. That is, the resin base 11 is formed in a cylindrical shape. Here, the opening part OP1 and the opening part OP2 are arranged to face each other.

The substrate 12 has card edge connectors 12a ($12a_1$ and $12a_2$) electrically connected to an external female connector. The card edge connector $12a_1$ is inserted into a slit 13a, formed on the resin cover $13_1$. The card edge connector $12a_2$ is inserted in to a slit $13a_2$ formed on the resin cover $13_2$.

The resin cover $13_1$ is fixed on an inner surface of the resin base 11 forming the opening part OP1. The resin cover $13_2$ is fixed on an inner surface of the resin base 11 forming the opening part OP2. Here, the resin cover $13_1$ and the resin cover $13_2$ are arranged to face each other.

Figure 2B:
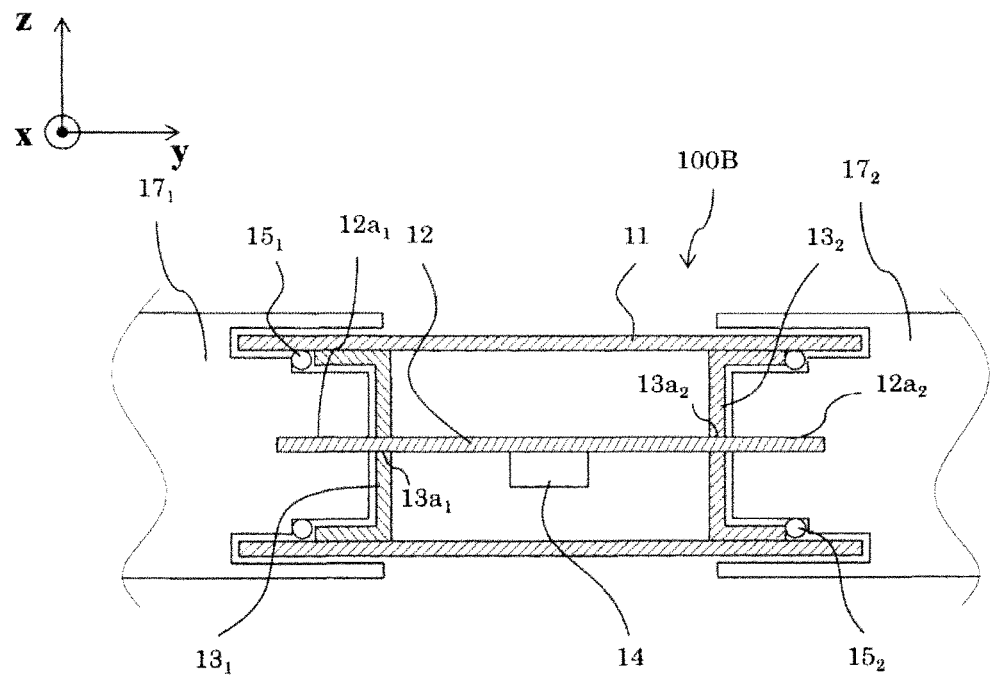
FIG. 2B illustrates a connection of the electronic control device and an external female connector according to the second embodiment of the present invention.

Next, a function of the electronic control device 100B is described with reference to FIG. 2B. FIG. 2B illustrates a connection of the electronic control device 100B and an external female connector 17 according to the second embodiment of the present invention.

As shown in FIG. 2B, an edge part of the electronic control device 100B at a side in which the card edge connector 12$a_1$ is protruded is fitted with the external female connector 17$_1$. An edge part of the electronic control device 100B at a side in which the card edge connector 12$a_2$ is protruded is fitted with the external female connector 17$_2$.

A sealing member 15$_1$ waterproofs the card edge connector 12$a_1$. Further, the sealing member 15$_1$ prevents liquid such as water from entering the electronic control device 100B through a region where the slit 13$a_1$ formed on the resin cover 13$_1$ and the substrate 12 are contacted with each other. Further, the sealing member 15$_1$ prevents liquid such as water from entering the electronic control device 100B through a region where the resin cover 13$_1$ and the resin base 11 are contacted with each other.

A sealing member 15$_2$ waterproofs the card edge connector 12$a_2$. Further, the sealing member 15$_2$ prevents liquid such as water from entering the electronic control device 100B through a region where the slit 13$a_2$ formed on the resin cover 13$_2$ and the substrate 12 are contacted with each other. Further, the sealing member 15$_2$ prevents liquid such as water from entering the electronic control device 100B through a region where the resin cover 13$_2$ and the resin base 11 are contacted with each other.

As described above, according to the present embodiment, it makes possible to ensure a waterproof property while suppressing a number of components. Further, less number of the components facilitates its assembling. Accordingly, the manufacturing cost can be reduced.

Third Embodiment

Figure 3:
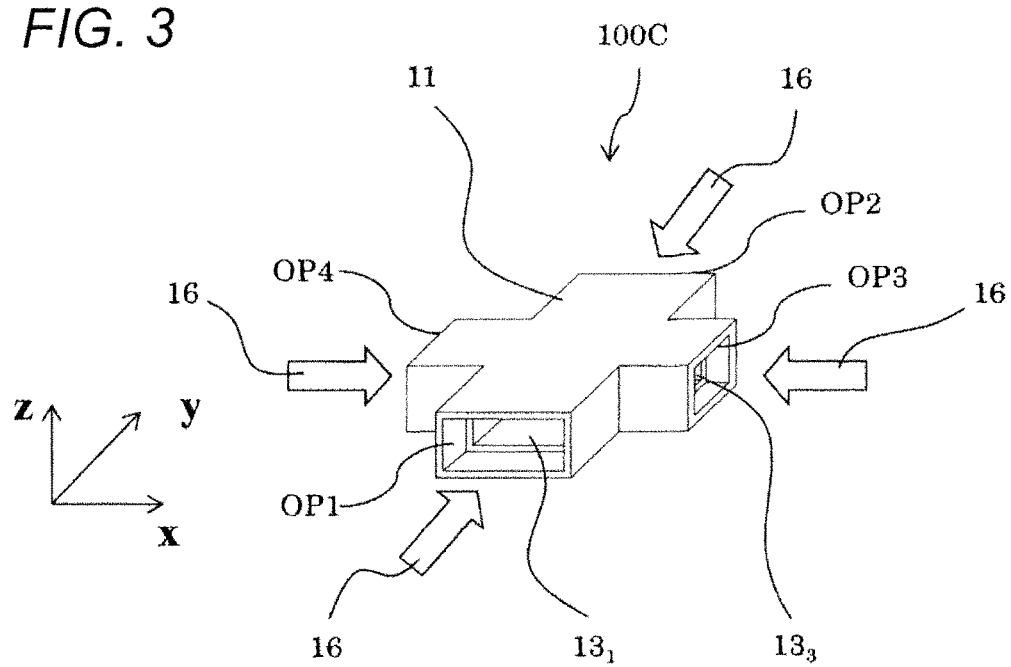
FIG. 3 is a perspective view of an electronic control device according to a third embodiment of the present invention.

Next, a configuration of an electronic control device 100C is described with reference to FIG. 3. FIG. 3 is a perspective view of the electronic control device 100C according to a third embodiment of the present invention.

The electronic control device 100C is provided with a resin base 11, a substrate 12, and four resin covers 13 (13$_1$, 13$_2$, . . . ).

The resin base 11 has four opening parts OP (OP1, OP2, OP3, and OP4). In FIG. 3, all the opening parts OP are communicated with each other. In FIG. 3, the opening part OP1 and the opening part OP2 are arranged to face each other, and the opening part OP3 and the opening part OP4 are arranged to face each other. The opening part OP1 and the opening part OP3 are arranged to be perpendicular to each other.

The substrate 12 (not shown) has four card edge connectors 12$a$ formed in four directions, respectively, and each of the card edge connector is connected to an external connector.

After the substrate 12 is slid and inserted into the resin base 11, the four resin covers 13 (13$_1$, 13$_2$, 13$_3$, and 13$_4$) are disposed and fixed to cover the four opening parts OP (OP1, OP2, OP3, and OP4), respectively.

Here, the opening parts OP (OP1, OP2, OP3, and OP4) are formed at edge surfaces of the resin base 11 perpendicular to the substrate 12 on which an electronic component 14 is mounted. Four external female connectors 17 (not shown) are fitted with four opening parts OP (OP1, OP2, OP3, and OP4) served as connector frontages, respectively, by moving in respective directions shown by arrows 16.

As described above, according to the present embodiment, it makes possible to ensure a waterproof property while suppressing a number of components. Further, less number of the components facilitates its assembling. Accordingly, the manufacturing cost can be reduced. Furthermore, a plurality of external female connectors 17 can be connected.

Fourth Embodiment

Figure 4A:
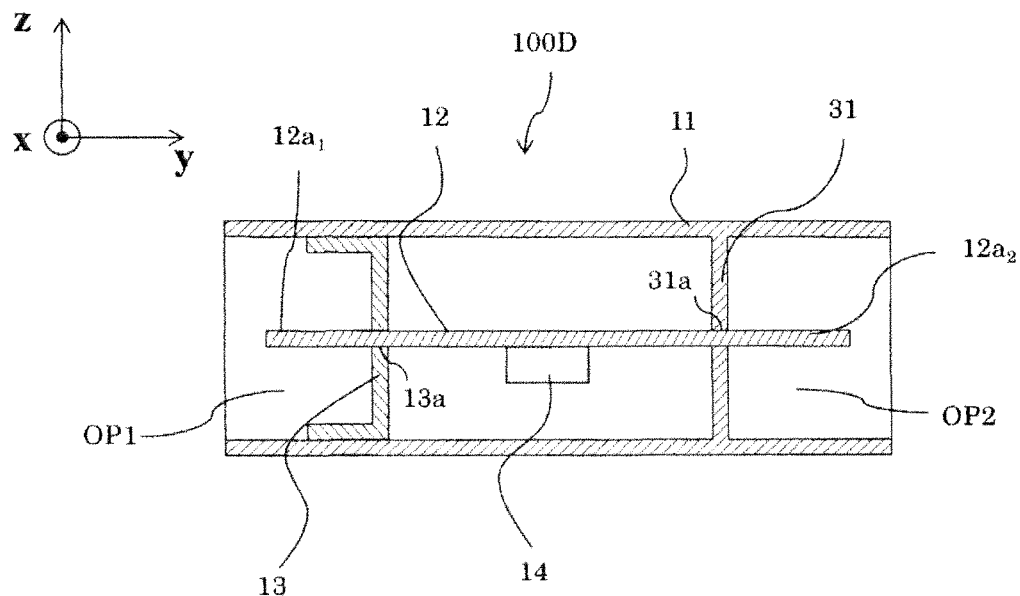
FIG. 4A is a cross-sectional view of an electronic control device according to a fourth embodiment of the present invention.

Next, a configuration of an electronic control device 100D is described with reference to FIG. 4A. FIG. 4A is a cross-sectional view of the electronic control device 100D according to a fourth embodiment of the present invention.

The electronic control device 100D is provided with a resin base 11, a substrate 12, a resin cover 13, and a partition wall 31.

A card edge connector 12$a_2$ is inserted into a slit 31$a$ formed on the partition wall 31. The partition wall 31 is integrally formed with an inner surface of the resin base 11 forming an opening part OP2.

Figure 4B:
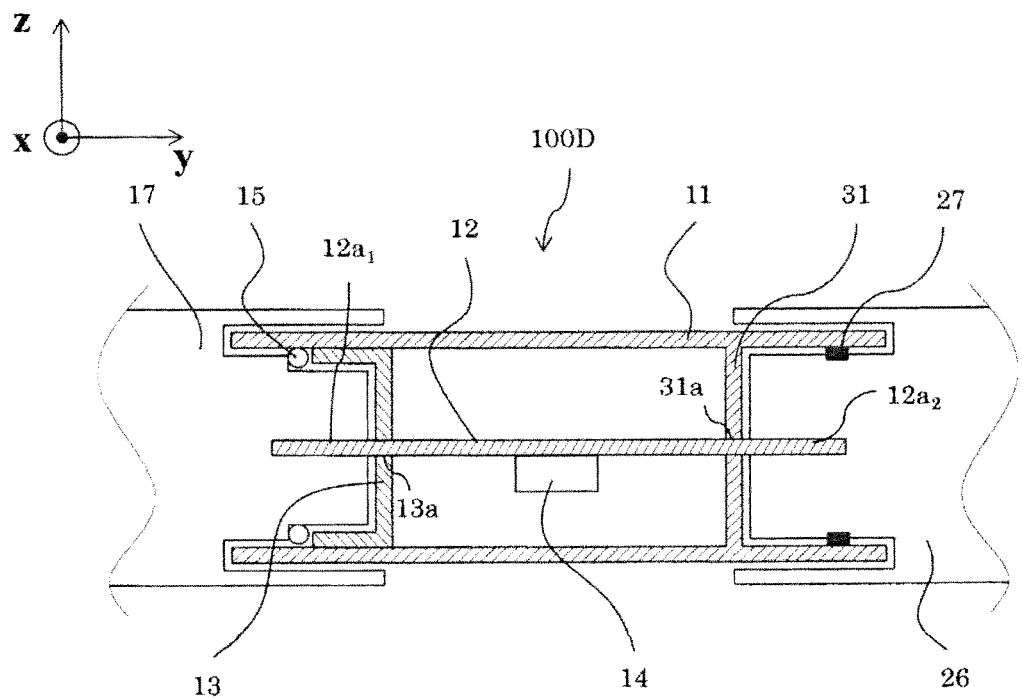
FIG. 4B illustrates a connection of the electronic control device and an external female connector according to the fourth embodiment of the present invention.

Next, a function of the electronic control device 100D is described with reference to FIG. 4B. FIG. 4B illustrates a connection of the electronic control device 100D and external female connectors 17 and 26 according to the fourth embodiment of the present invention.

A sealing member 27 (for example, an elastic member such as a rubber seal) disposed on the external female connector 26 waterproofs the card edge connector 12$a_2$. Further, the sealing member 27 prevents liquid from entering the electronic control device 100D through a region where the slit 31$a$ formed on the partition wall 31 and the substrate 12 are contacted with each other.

As described above, according to the present embodiment, it makes possible to ensure a waterproof property while suppressing a number of components. Further, less number of the components facilitates its assembling. Accordingly, the manufacturing cost can be reduced.

Fifth Embodiment

Figure 5A:
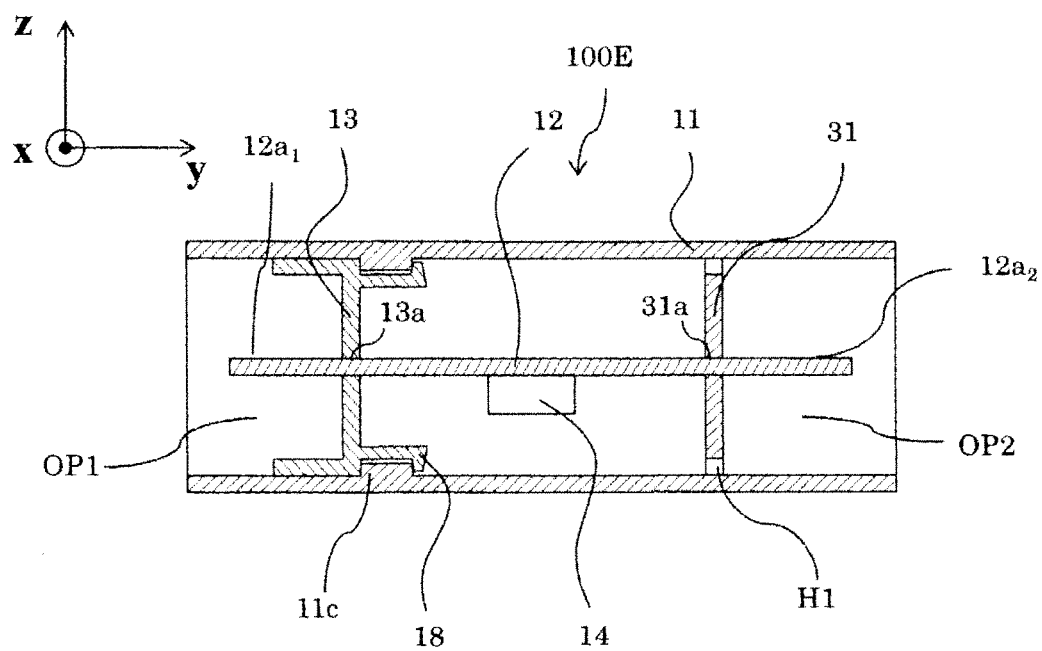
FIG. 5A is a cross-sectional view of an electronic control device according to a fifth embodiment of the present invention.

Next, a configuration of an electronic control device 100E is described with reference to FIG. 5A. FIG. 5A is a cross-sectional view of the electronic control device 100E according to a fifth embodiment of the present invention.

The electronic control device 100E is provided with a resin base 11, a substrate 12, a resin cover 13, and a partition wall 31.

The resin cover 13 has a snap fit 18 at a bottom part thereof. The snap fit 18 is engaged with a projection 11$c$ formed on an inner surface of the resin base 11. With such a configuration, the resin cover 13 is fixed on the inner surface of the resin base 11 forming an opening part OP1. The variation in dimensions of the substrate 12 can be absorbed by the snap fit 18.

Here, in FIG. 5A, the snap fits 18 are provided at an upper part (z-axis (+) side) and a lower part (z-axis (−) side) of a bottom part of the resin cover 13. A hole H1 of the partition wall 31 is formed for a die forming the projection 11$c$.

As described above, according to the present embodiment, it makes possible to ensure a waterproof property while suppressing a number of components. Further, less number of the components facilitates its assembling. Accordingly, the manufacturing cost can be reduced. Furthermore, the variation in dimensions of the substrate 12 can be absorbed.

Variation of Fifth Embodiment

Next, a configuration of a variation of the electronic control device 100E is described with reference to FIG. 5B.

Figure 5B:
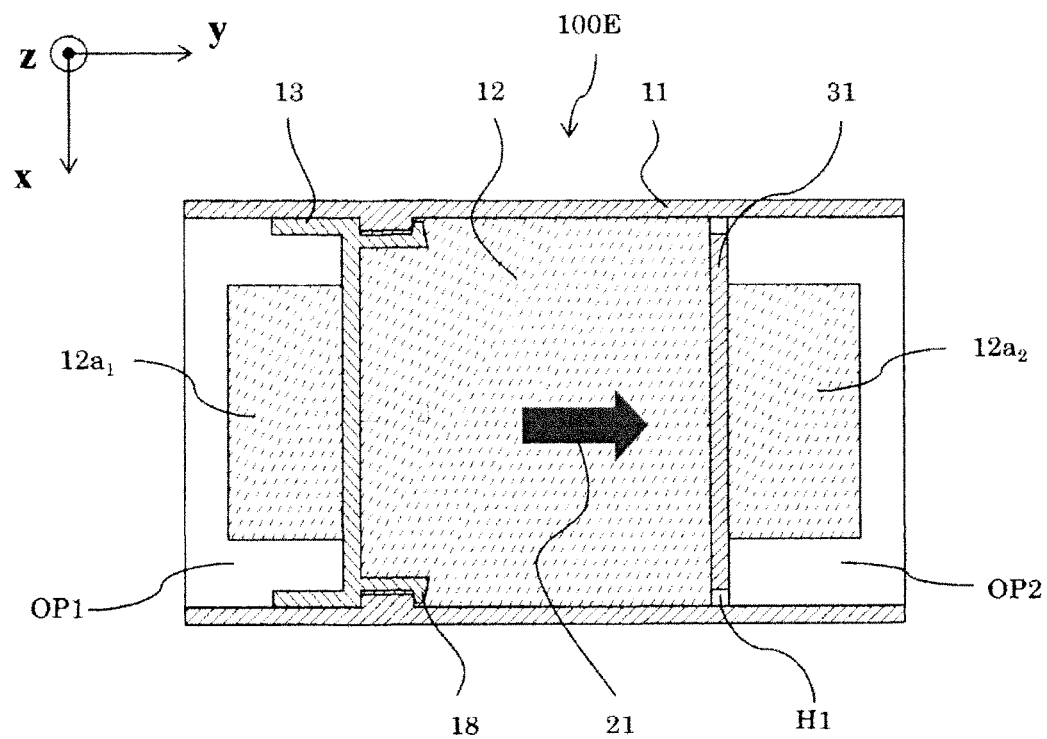
FIG. 5B is a cross-sectional view of a variation of the electronic control device according to the fifth embodiment of the present invention.

FIG. 5B is a cross-sectional view of the variation of the electronic control device 100E according to the fifth embodiment of the present invention.

In FIG. 5B, the position of the snap fit 18 is different from that in FIG. 5A. That is, in FIG. 5A, the snap fits 18 are provided at a left part (x-axis (+) side) and a right part (x-axis (−) side) of the bottom part of the resin cover 13.

Sixth Embodiment

Figure 6:
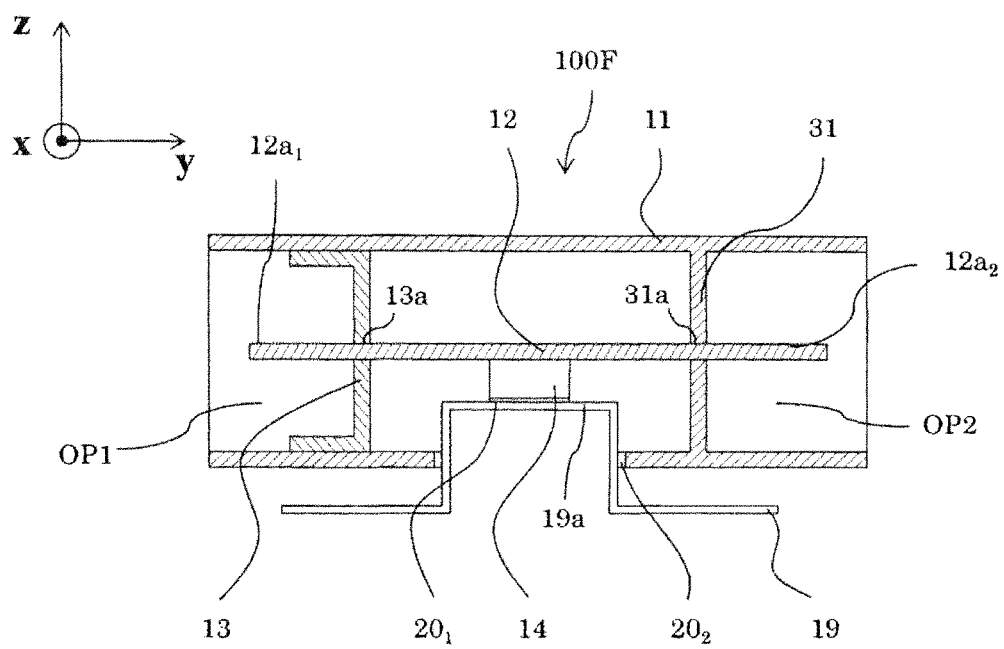
FIG. 6 is a cross-sectional view of an electronic control device according to a sixth embodiment of the present invention.

Next, a configuration of an electronic control device 100F is described with reference to FIG. 6. FIG. 6 is a cross-sectional view of the electronic control device 100F according to a sixth embodiment of the present invention.

The electronic control device 100F is provided with a resin base 11, a substrate 12, a resin cover 13, a partition wall 31, and a heat radiation member 19.

The heat radiation member 19 (for example, a metal member) has a projection 19a. The projection 19a is, for example, formed by drawing the center region of a metal plate. The resin base 11 has an opening part for the heat radiation member at a lower part (z-axis (−) side) of the resin base 11. The opening part is communicated with an electronic component 14. The projection 19a of the heat radiation member 19 is fitted with the opening part for the heat radiation member to be adjacent to the electronic component 14.

The heat radiation member 19 and the electronic component 14 are fixed to each other by a heat radiating filler $20_1$ (heat radiating adhesive). With such a configuration, heat generated by the electronic component 14 is transferred to the heat radiation member 19 via the filler $20_1$ and radiated.

Further, the heat radiation member 19 and the resin base 11 are fixed to each other by a non-heat radiating filler $20_2$. With such a configuration, an inner space of the electronic control device 100F is waterproofed. Here, the heat radiating filler $20_1$ may be used instead of the non-heat radiating filler $20_2$.

As described above, according to the present embodiment, it makes possible to ensure a waterproof property while suppressing a number of components. Further, less number of the components facilitates its assembling. Accordingly, the manufacturing cost can be reduced. Furthermore, it makes possible to radiate heat of the electronic component while suppressing a number of components.

Variation of Sixth Embodiment

Figure 7:
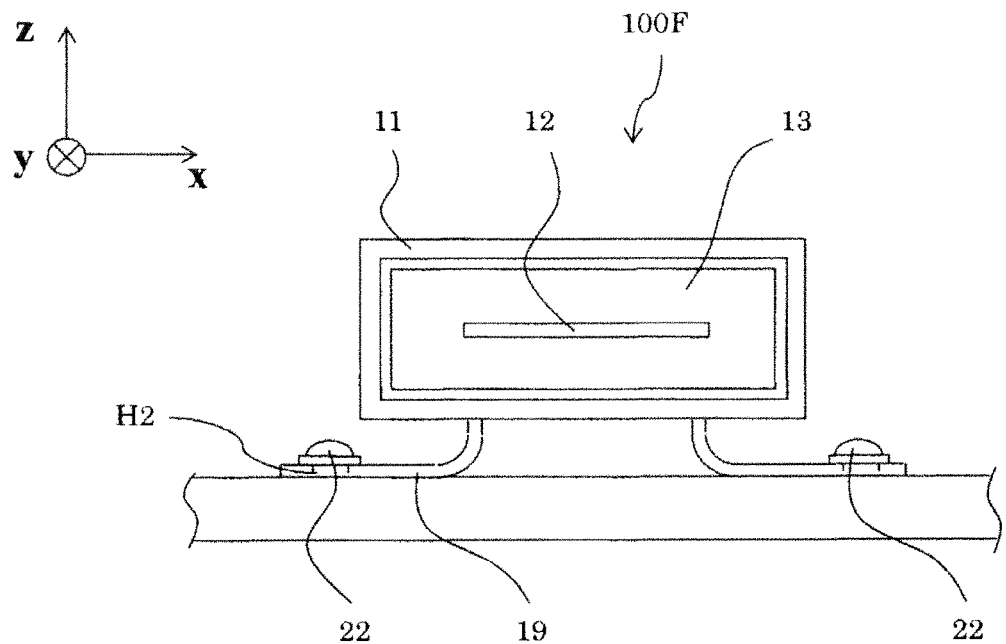
FIG. 7 is a front view of a variation of the electronic control device according to the sixth embodiment of the present invention.

Next, a configuration of a variation of the electronic control device 100F is described with reference to FIG. 7. FIG. 7 is a front view of the variation of the electronic control device 100F according to the sixth embodiment of the present invention.

A heat radiation member 19 has a hole H2 into which a screw 22 is inserted. The screw 22 is inserted into the hole H2 and screwed with a female screw (screw hole) disposed on a vehicle body. The screw 22 and the hole H2 are served as a fixing part which fixes the heat radiation member 19 on the vehicle body. With such a configuration, the electronic control device 100F is fixed on the vehicle body.

As described above, according to the present embodiment, it makes possible to ensure a waterproof property while suppressing a number of components. Further, less number of the components facilitates its assembling. Accordingly, the manufacturing cost can be reduced. Furthermore, it makes possible to radiate heat of the electronic component while suppressing a number of components.

Seventh Embodiment

Figure 8:
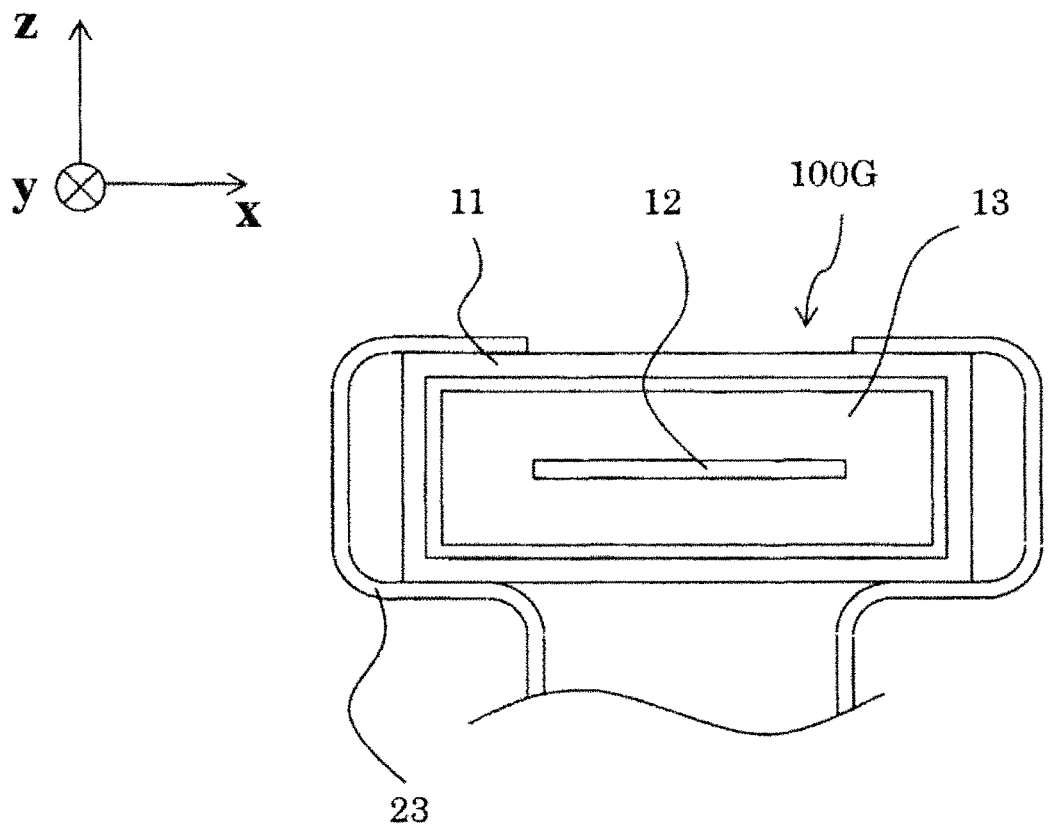
FIG. 8 is a front view of an electronic control device according to a seventh embodiment of the present invention.

Next, a configuration of an electronic control device 100G is described with reference to FIG. 8. FIG. 8 is a front view of the electronic control device 100G according to a seventh embodiment of the present invention.

The electronic control device 100G is provided with a resin base 11, a substrate 12, a resin cover 13, and a clip 23.

The resin base 11 is held such that the resin base 11 is interposed by a pair of clips 23 fixed on a vehicle body. With such a configuration, fixation of the electronic control device 100F onto the vehicle body can be facilitated.

As described above, according to the present embodiment, it makes possible to ensure a waterproof property while suppressing a number of components. Further, less number of the components facilitates its assembling. Accordingly, the manufacturing cost can be reduced.

The present invention is not limited to the embodiments described above and may include various types of variations. The embodiments described above are merely described for easy understanding of the present invention, and are not necessarily limited to what includes all of the described configurations. Further, a part of a configuration of a certain embodiment can be substituted by a configuration of another embodiment, and a configuration of another embodiment can be added to a configuration of a certain embodiment. Addition, deletion, or substitution of other configurations can be carried out for parts of configurations of the respective embodiments.

Figure 9A:
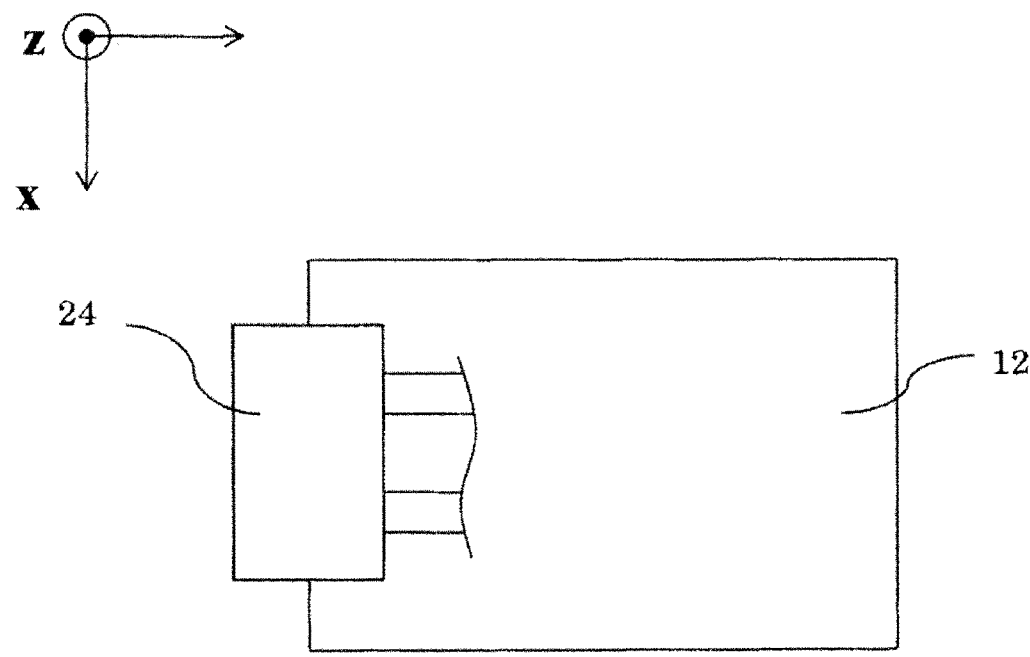
FIG. 9A is a top view of a box-type connector used in the electronic control device according to the first through seventh embodiments of the present invention.
Figure 9B:
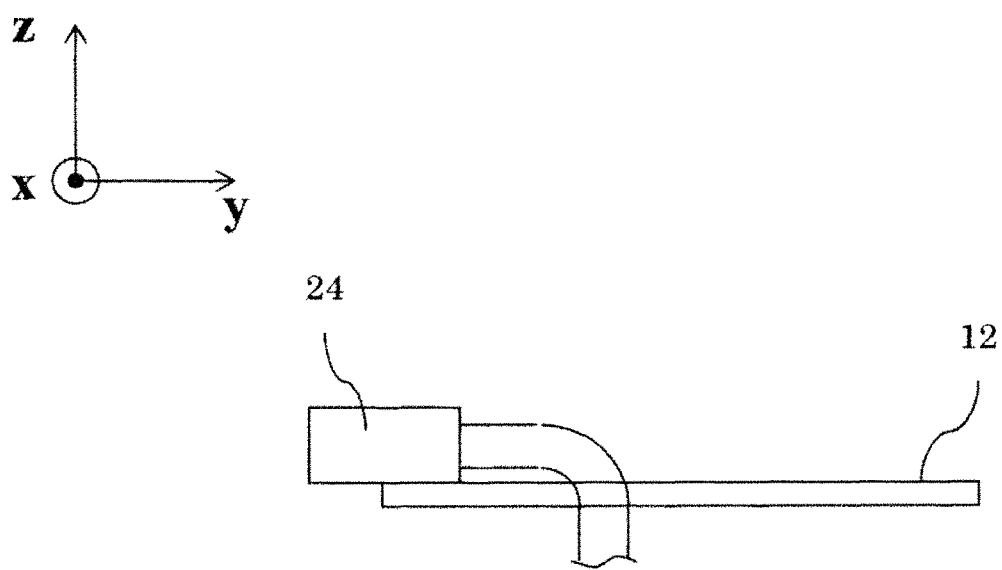
FIG. 9B is a side view of the box-type connector shown in FIG. 9A.

For example, in the electronic control device according to the first to seventh embodiments of the present invention, a connector mounted on the substrate 12 is formed as the card edge connector 12a, however a box-type connector 24 shown in FIGS. 9A and 9B may be adopted. Here, FIG. 9A is a top view of the box-type connector 24 used in the electronic control device according to the first through seventh embodiments of the present invention. FIG. 9B is a side view of the box-type connector 24 shown in FIG. 9A.

REFERENCE SIGNS LIST

11 . . . resin base (housing)
12 . . . substrate
12a . . . card edge connector
13 . . . resin cover
13a . . . slit
14 . . . electronic component
15, 27 . . . sealing member (packing)
16 . . . female connector fitting direction
17, 26 . . . female connector
18 . . . snap fit
19 . . . metal member
20 . . . filler
21 . . . substrate inserting direction
22 . . . screw
23 . . . clip
24 . . . connector
31 . . . partition wall
31a . . . slit
100A, 100B, 100C, 100D, 100E, 100F, 100G . . . electronic control device.

The invention claimed is:
1. An electronic control device, comprising:
a base having at least one opening part;

a first cover disposed on an inner surface of the base forming a first opening part and having a first slit;
a substrate having a first connection pattern to be connected to outside, the first connection pattern being inserted into the first slit; and
a sealing member disposed between the base and the first cover,
wherein the first cover comprises a cylindrical portion and a planar bottom, the cylindrical portion sliding along the inner surface of the base, and a space being formed between an inner surface of the cylindrical portion of the first cover and the first connection pattern of the substrate, and
wherein a stepped part contacts the sealing member which is provided on an external female connector, the stepped part being formed by a distal end of the cylindrical portion of the first cover and the inner surface of the base.

2. The electronic control device according to claim 1, wherein a distance D1 between a bottom part of the first cover and an edge of the first cover is shorter than a distance D2 between the bottom part of the first cover and an edge of the base.

3. The electronic control device according to claim 1, wherein the base is formed in a cylindrical shape having a bottom.

4. The electronic control device according to claim 1, further comprising a second cover fixed on an inner surface of the base forming a second opening part and having a second slit,
wherein the substrate has a second connection pattern inserted into the second slit.

5. The electronic control device according to claim 4, wherein the first opening part and the second opening part are arranged to face each other.

6. The electronic control device according to claim 5, further comprising a third cover fixed on an inner surface of the base forming a third opening part and having a third slit,
wherein the substrate has a third connection pattern inserted into the third slit.

7. The electronic control device according to claim 6, wherein the first opening part and the third opening part are arranged to be perpendicular to each other.

8. The electronic control device according to claim 6, further comprising a fourth cover fixed on an inner surface of the base forming a fourth opening part and having a fourth slit,
wherein the substrate has a fourth connection pattern inserted into the fourth slit.

9. The electronic control device according to claim 8, wherein the third opening part and the fourth opening part are arranged to face each other.

10. The electronic control device according to claim 1, wherein the base further comprises a partition wall having a second slit, the partition wall being disposed on an inner surface of the base forming a second opening part, and
the substrate has a second connection pattern inserted into the second slit.

11. The electronic control device according to claim 1, wherein the first cover is fixed on the inner surface of the base forming the first opening part by a snap fit.

12. The electronic control device according to claim 1, further comprising a heat radiation member having a projection,
wherein the base has an opening part for the heat radiation member which communicates with an electronic component, and
the projection of the heat radiation member is fitted with the opening part for the heat radiation member such that the projection is located adjacent to the electronic component.

13. The electronic control device according to claim 12, wherein the heat radiation member has a fixing part which fixes the heat radiation member onto a vehicle body.

14. The electronic control device according to claim 1, comprising a clip which fixes the base to a vehicle body.

15. The electronic control device according to claim 1, wherein the first connection pattern is served as a card edge connector.

16. An electronic control device, comprising:
a base having at least one opening part;
a first cover disposed on an inner surface of the base forming a first opening part and having a first slit;
a substrate having a first connection pattern to be connected to outside, the first connection pattern being inserted into the first slit; and
a sealing member disposed between the base and the first cover, the sealing member provided on an external female connector,
wherein a stepped part with which the sealing member is contacted is formed by an edge of the first cover and the inner surface of the base forming the first opening part, and a distance D1 between a bottom part of the first cover and the edge of the first cover is shorter than a distance D2 between the bottom part of the first cover and an edge of the base.

17. An electronic control device, comprising:
a base having at least one opening part;
a first cover disposed on an inner surface of the base forming a first opening part and having a first slit;
a substrate having a first connection pattern to be connected to outside, the first connection pattern being inserted into the first slit;
a sealing member disposed between the base and the first cover;
a second cover fixed on an inner surface of the base forming a second opening part and having a second slit, wherein the substrate has a second connection pattern inserted into the second slit; and
a third cover fixed on an inner surface of the base forming a third opening part and having a third slit, wherein the substrate has a third connection pattern inserted into the third slit.

18. The electronic control device according to claim 17, wherein the first opening part and the third opening part are arranged to be perpendicular to each other.

19. The electronic control device according to claim 17, wherein the first opening part and the second opening part are arranged to face each other, and the first opening part and the third opening part are arranged to be perpendicular to each other.

* * * * *